(12) United States Patent
Schroeck et al.

(10) Patent No.: US 8,906,157 B2
(45) Date of Patent: Dec. 9, 2014

(54) METHOD FOR PULLING A SINGLE CRYSTAL COMPOSED OF SILICON WITH A SECTION HAVING A DIAMETER THAT REMAINS CONSTANT

(75) Inventors: Thomas Schroeck, Burgkirchen (DE); Wilfried von Ammon, Hochburg (AT); Claus Kropshofer, Braunau (AT)

(73) Assignee: Siltronic AG, Munich (DE)

( * ) Notice: Subject to any disclaimer, the term of this patent is extended or adjusted under 35 U.S.C. 154(b) by 1078 days.

(21) Appl. No.: 12/913,964

(22) Filed: Oct. 28, 2010

(65) Prior Publication Data

US 2011/0126757 A1    Jun. 2, 2011

(30) Foreign Application Priority Data

Dec. 2, 2009    (DE) .................. 10 2009 056 638

(51) Int. Cl.
| | |
|---|---|
| C30B 15/02 | (2006.01) |
| C30B 30/04 | (2006.01) |
| C30B 15/30 | (2006.01) |
| C30B 29/06 | (2006.01) |
| C30B 15/22 | (2006.01) |

(52) U.S. Cl.
CPC .................. C30B 29/06 (2013.01); C30B 30/04 (2013.01); C30B 15/305 (2013.01); C30B 15/22 (2013.01)
USPC .............................. 117/15; 117/13; 117/932

(58) Field of Classification Search
USPC ........................................ 117/15, 16, 13, 932
See application file for complete search history.

(56) References Cited

U.S. PATENT DOCUMENTS

| | | | |
|---|---|---|---|
| 6,132,507 A | 10/2000 | Von ammon et al. | |
| 6,153,008 A | 11/2000 | Von Ammon et al. | |
| 6,776,840 B1* | 8/2004 | Fuerhoff et al. ................ | 117/15 |
| 7,431,764 B2* | 10/2008 | Fu et al. ........................... | 117/3 |
| 8,043,427 B2* | 10/2011 | Sattler et al. .................... | 117/13 |
| 2002/0043206 A1 | 4/2002 | Mutti et al. | |
| 2004/0192015 A1 | 9/2004 | Ammon et al. | |
| 2010/0024718 A1* | 2/2010 | Orschel et al. ................. | 117/15 |

FOREIGN PATENT DOCUMENTS

| | | |
|---|---|---|
| CN | 1344335 A1 | 4/2002 |
| CN | 1396965 | 4/2002 |
| DE | 103 39 792 A1 | 10/2004 |
| DE | 60111071 T2 | 10/2005 |
| EP | 0 866 150 A1 | 9/1998 |
| EP | 0 926 270 A1 | 6/1999 |

(Continued)

OTHER PUBLICATIONS

T. Sinno et al., "Defect Engineering of Czochralski Single-Crystal Silicon", Materials Science and Engineering, R: Reports, vol. 28 (Jul. 14, 2000) Issues 5-6, pp. 149-198—ISSN 0927-796X.

*Primary Examiner* — Bob M Kunemund
(74) *Attorney, Agent, or Firm* — Brooks Kushman P.C.

(57) ABSTRACT

Single crystal composed of silicon with a section having a diameter that remains constant, are pulled by a method wherein the single crystal is pulled with a predefined pulling rate $v_p$ having the units [mm/min]; and the diameter of the single crystal in the section having a diameter that remains constant is regulated to the predefined diameter by regulating the heating power of a first heating source which supplies heat to the single crystal and to a region of the melt that adjoins the single crystal and is arranged above the melt, such that diameter fluctuations are corrected with a period duration T that is not longer than $(2 \cdot 18 \text{ mm})/v_p$.

4 Claims, 5 Drawing Sheets

(56) References Cited

FOREIGN PATENT DOCUMENTS

| EP | 1171652 B1 | 1/2003 |
|---|---|---|
| EP | 1541721 A1 | 6/2005 |
| EP | 2071060 A1 | 6/2009 |
| JP | 59064592 A | 4/1984 |
| JP | 10101482 A | 4/1998 |
| JP | 2001019588 A | 1/2001 |
| WO | 00/56956 A1 | 9/2000 |
| WO | 01/57294 A1 | 8/2001 |
| WO | 03/004734 A1 | 1/2003 |

* cited by examiner

METHOD FOR PULLING A SINGLE CRYSTAL COMPOSED OF SILICON WITH A SECTION HAVING A DIAMETER THAT REMAINS CONSTANT

CROSS-REFERENCE TO RELATED APPLICATIONS

This application claims priority to German Patent Application No. DE 10 2009 056638.4 filed Dec. 2, 2009 which is herein incorporated by reference.

BACKGROUND OF THE INVENTION

1. Field of the Invention

The invention relates to a method for pulling a single crystal composed of silicon with a section having a diameter that remains constant. The single crystal grows while a monocrystalline seed crystal is raised from a melt contained in a crucible, with a specific pulling rate $v_p$. The aim of the method is to obtain a single crystal composed of silicon with a longest possible cylindrical section having a predefined desired diameter which is suitable for further processing to form semiconductor wafers. Temperature fluctuations in the melt alter the crystallization rate v with which the single crystal grows. If the pulling rate $v_p$ and the crystallization rate v do not match, the diameter of the single crystal varies. It is necessary, therefore, for deviations of the diameter from the desired diameter that are brought about by temperature fluctuations in the melt to be minimized by means of the diameter being regulated.

2. Background Art

The requirement for achieving a situation in which the diameter in the section having a diameter that remains constant deviates as little as possible from the desired diameter can be met satisfactorily, considered in isolation, by compensating for deviations from the desired diameter by regulating the pulling rate $v_p$ and/or the supply of heat to the melt by means of a heating source arranged around the crucible. It is significantly more difficult to meet the requirement if it is simultaneously demanded that the quotient v/G of the crystallization rate v and the axial temperature gradient G at the phase boundary between the growing single crystal and the melt be kept within a narrow range. This is regularly demanded because v/G is crucial with regard to whether vacancies or silicon interstitials dominate as intrinsic point defects in the single crystal. In the event of supersaturation, vacancies or silicon interstitials aggregate to form larger units and form defects such as FPDs ("flow pattern defects") or Lpits ("large etch pits"). In general, the formation of such defects must be avoided, but this is only accomplished if v/G remains within the narrowest possible limits during the pulling of the section having a diameter that remains constant. The requirement to match the diameter in the section having a diameter that remains constant with respect to the desired diameter and the requirement to keep v/G within narrow limits lead to a conflict because, on the one hand, an adaptation of the pulling rate $v_p$ to an altered crystallization rate v caused by temperature fluctuations in the melt readily has the consequence that the narrow limits for v/G are deviated from and, on the other hand, a correction of the altered crystallization rate v by changing the supply of heat to the melt by means of a heating source arranged around the crucible brings about a deviation from the desired diameter. It is difficult, therefore, to regulate the diameter to a desired diameter without having to disregard the regulation of v/G, and vice versa.

EP 1 541 721 A1 describes measures for regulating the diameter and measures for regulating v/G, but they cannot resolve the above-mentioned conflict.

SUMMARY OF THE INVENTION

It is an object of the present invention to offer an improved method which comprises efficient regulation of the diameter and at the same time reliably avoids having to accept the formation of undesirable defects such as FPDs or Lpits.

These and other objects are achieved by means of a method for pulling a single crystal composed of silicon with a section having a diameter that remains constant, comprising pulling the single crystal with a predefined desired pulling rate $v_p$ having the unit [mm/min]; and regulating the diameter of the single crystal in the section having a diameter that remains constant to a predefined desired diameter by means of regulating the heating power of a first heating source, which supplies heat to the single crystal and to a region of the melt that adjoins the single crystal, and which is arranged above the melt, in such a way that diameter fluctuations are corrected with a period duration T that is not longer than $(2\cdot18 \text{ mm})/v_p$.

DETAILED DESCRIPTION OF THE PREFERRED EMBODIMENT(S)

In contrast to the method described in EP 1 541 721 A1, the present method dispenses with using the pulling rate $v_p$ as a manipulated variable for regulating the diameter in the cylindrical section. This avoids the situation in which deviations between the pulling rate $v_p$ and the crystallization rate v occur owing to the regulation of the diameter. Instead, the diameter is regulated by means of the heating power of a first heating source, which supplies heat to the single crystal and to a region of the melt that adjoins the single crystal, and which is arranged above the melt.

EP 0 866 150 A1 reveals that the use of such a heating source has the effect that the axial temperature gradient G along the phase boundary is uniform. EP 0 926 270 A1 reveals that the use of such a heating source is suitable for reducing diameter and pulling rate fluctuations. If both documents are taken into consideration equally, it may be concluded that it is not possible to resolve the abovementioned conflict by the regulation of the diameter by means of regulating the pulling rate, $v_p$ being replaced by regulation that deviates therefrom and uses the heating power of the heating source arranged above the melt as a manipulated variable, for the use of such a heating source, in accordance with EP 0 866 150 A1, also brings about an alteration of the axial temperature gradient G and, consequently, also a change in the quotient v/G that determines the defect properties.

As the inventors have discovered, however, the influence on the quotient v/G lacks disadvantageous consequences if diameter fluctuations are corrected with a period duration T that is not longer than (2·18 mm)/$v_p$. If this condition is complied with, concentration differences of intrinsic point defects are reduced by diffusion and mutual quenching. If the period duration is longer, regions with an excess of vacancies attain a length such that the diffusion length of silicon interstitials, which is approximately 18 mm, no longer suffices for mutual quenching.

Figure 1:
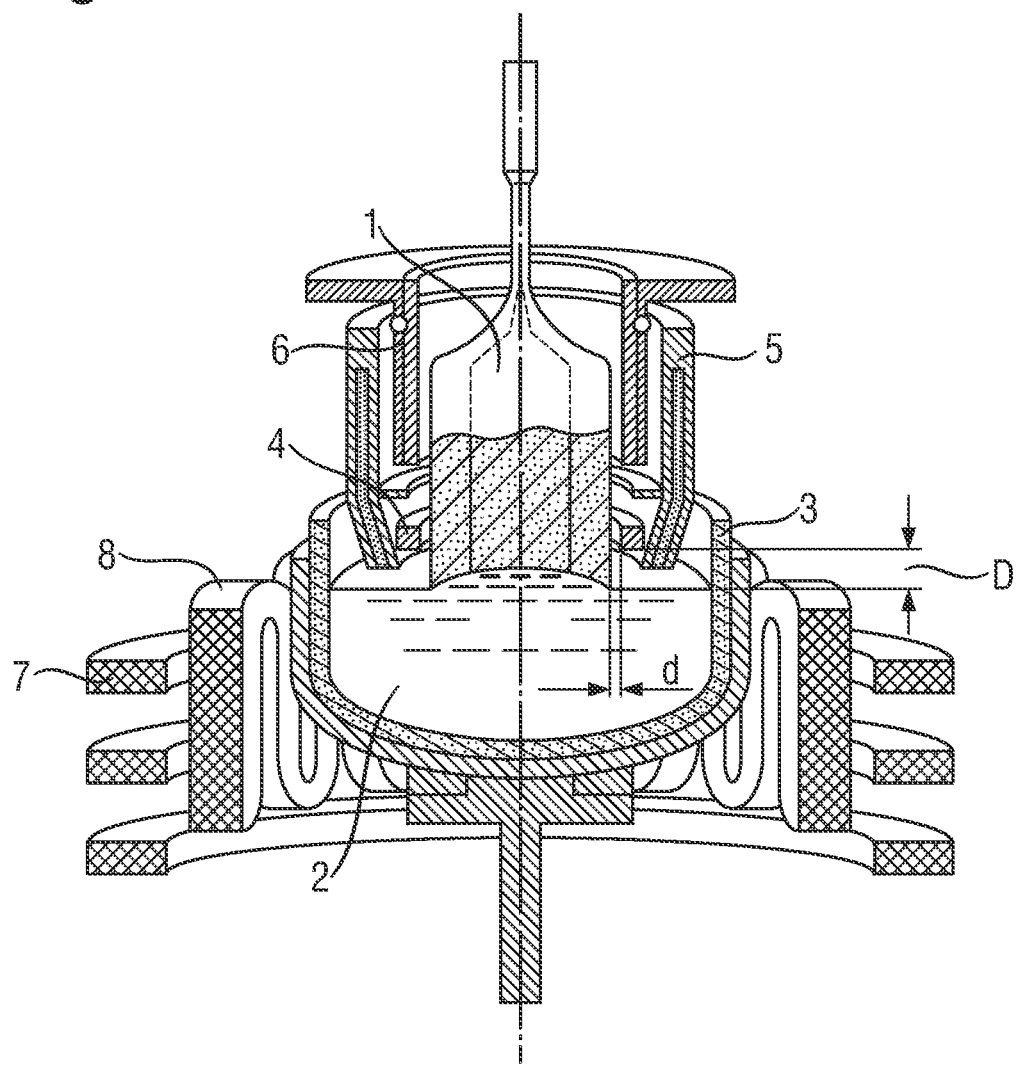
FIG. 1 illustrates one embodiment of a CZ apparatus suitable for use in the inventive method.

FIG. 1 shows the situation during which a section having a diameter that remains constant (cylindrical section) of a single crystal 1 composed of silicon is pulled from a melt 2 contained in a crucible 3. The furnace configuration shown ("hot zone") is particularly suitable for carrying out the invention. It comprises a first heating source 4, which is arranged above the melt 2 and around the growing single crystal 1, a heat shield 5, which shields the single crystal 1 from thermal radiation and is arranged around the single crystal 1 and around the first heating source 4, a device for cooling 6 the single crystal 1, which is arranged above the first heating source 4 and around the single crystal 1, a device for generating and impressing a magnetic field 7 on the melt 2, preferably a CUSP field, and a second heating source 8, which is arranged around the crucible 3. The distance D between the bottom surface of the first heating source 4 and the surface of the melt 2 is preferably 30 to 70 mm. The distance d between the side surface of the single crystal 1 and the inner surface of the first heating source 4 is preferably 10 to 50 mm.

The regulating system, which is not illustrated, comprises a conventional unit with camera and image processing for optically measuring the diameter, a PID regulator for regulating the heating power of the first heating source 4 in the event of detected deviations of the diameter from a desired diameter and a PID regulator for regulating the heating power of the second heating source 8 in the event of detected deviations of the heating power of the first heating source 4 from a predefined curve.

Figure 2:
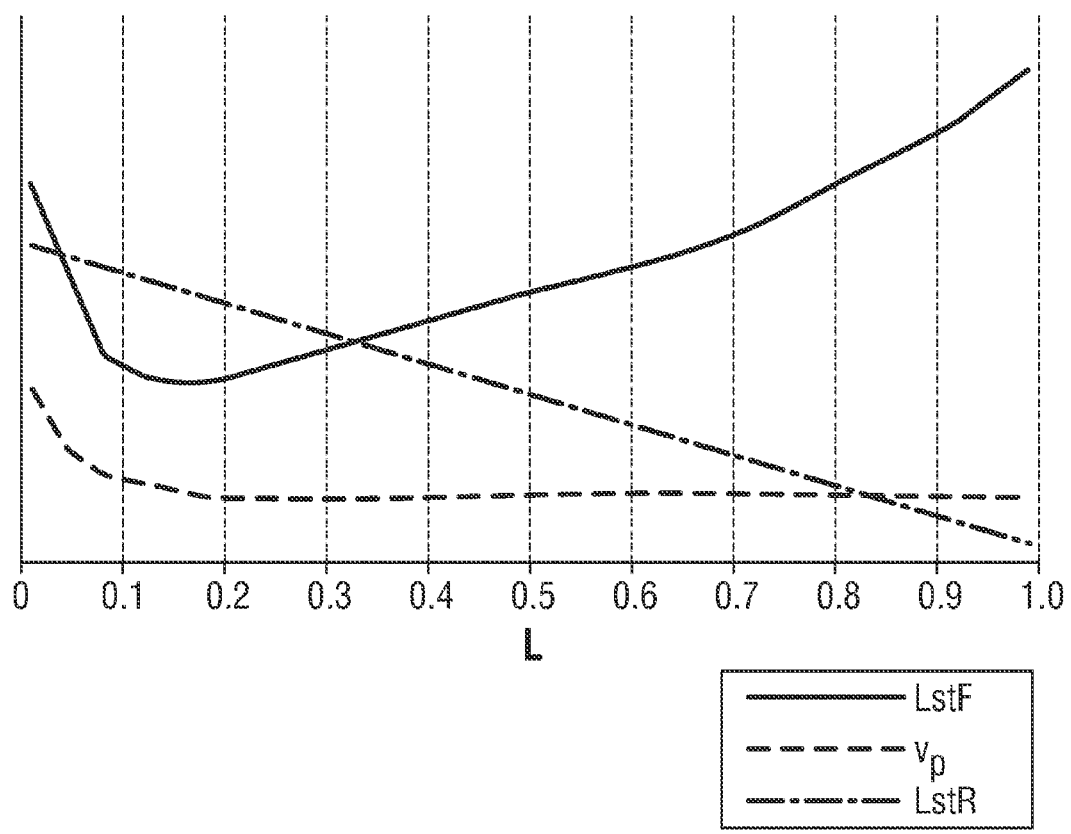
FIG. 2 illustrates predefined curves for pulling rate $v_p$ for heating power of first and second heating source.

FIG. 2 shows typical predefined curves for the pulling rate $v_p$, for the heating power LstR of the first heating source arranged above the melt, and for the heating power LstF of the second heating source arranged around the crucible. The predefined curves are chosen such that the quotient v/G during the pulling of the cylindrical section of the single crystal, with a disturbance-free progression, remains as constant as possible and preferably has a value which does not result in accumulations of intrinsic point defects. With the assistance of a commercial simulation program, the temporal development of the axial temperature gradient G can be determined for a predefined furnace configuration, which may likewise be determined also by the evaluation of defect distributions in longitudinal sections of experimentally pulled single crystals.

Temperature fluctuations in the melt, which occur in particular at the beginning of the pulling of the section of the single crystal having a diameter that remains constant and which are caused usually by convection currents, are thermal disturbances which change the crystallization rate v and, without corrective intervention, also result in a change in the diameter of the single crystal. The regulation of the diameter to the desired diameter also brings about in return a correction of the deviation of the crystallization rate v from the predefined crystallization rate that is caused by the thermal disturbance. According to the invention, when such disturbances occur, corrective intervention is effected by altering the heating power of the first heating source as a manipulated variable of a regulator for regulating the diameter, to be precise, altering in such a way that diameter fluctuations are corrected within a period duration T that is not longer than (2·18 mm)/$v_p$. A power band with a width of, on average, ±1 kW usually suffices for regulating the diameter. The first heating source is preferably dimensioned such that it can output heat with a peak power of up to 25 kW.

Figure 3:
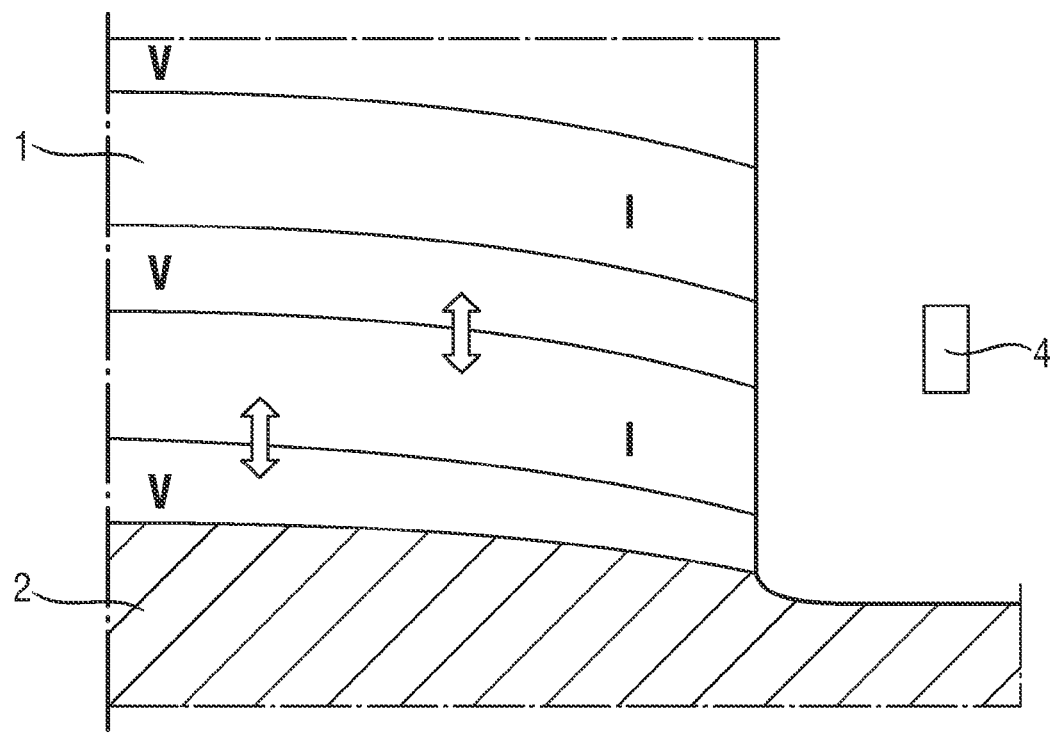
FIG. 3 illustrates correction of a change in crystallization rate triggered by thermal disturbance by regulation of a first heating source.

FIG. 3 shows how a change in the crystallization rate v triggered by a thermal disturbance and a correction in response thereto by means of the regulation of the heating power of the first heating source affect the formation of intrinsic point defects if the predefined curves for the pulling rate $v_p$, for the heating power LstR of the first heating source, and for the heating power LstF of the second heating source, for the disturbance-free case were chosen such that the quotient v/G corresponds to a critical value at which neither vacancies nor silicon interstitials are formed in excess. The regulation then brings about a periodic fluctuation of the crystallization rate v and thus also of the quotient v/G. The fluctuations of the crystallization rate v have the consequence that crystal regions V having an excess of vacancies and crystal regions I having an excess of silicon interstitials are formed which alternate. The length of the crystal regions in the growth direction of the single crystal corresponds approximately to the crystal length which grows during half a period of the fluctuations. In order that the diffusion of point defects, as indicated by double-headed arrows in FIG. 3, can take effect for reducing the excess by mutual quenching to the full extent, the length of one of the crystal regions should not be greater than a diffusion length or 18 mm. In order to ensure this, the regulation of the diameter by means of regulating the heating power of the first heating source must be effected with a time constant which is sufficiently short in order that a period duration during which a crystal region cannot attain a length of more than 18 mm results for a predefined pulling rate $v_p$. This is the case if the period duration T is not longer than (2·18 mm)/$v_p$ [min]. The influence of the diameter regulation carried out according to the invention on the axial temperature gradient G is small for a short time, in particular the influence on the axial temperature gradient G in the center of the growing single crystal. Changes in the axial temperature gradient in proximity to the edge of the single crystal which foster the formation of one type of intrinsic point defects do not have a disadvantageous effect because an excess of such point defects is reduced by radial diffusion to the edge of the single crystal.

Figure 4:
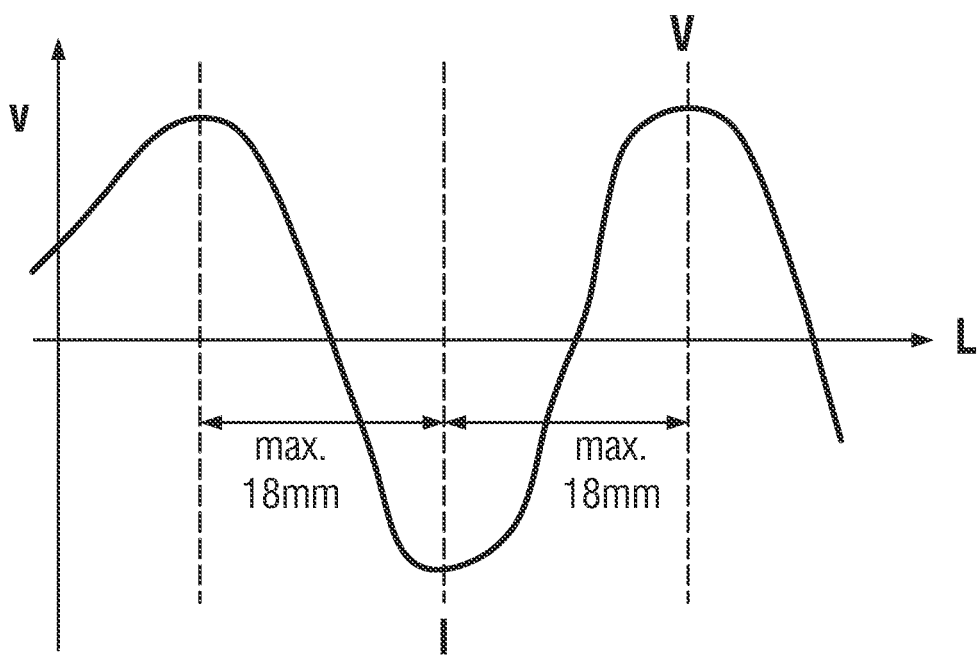
FIG. 4 illustrates fluctuation in the crystallization rate due to regulation of the heating power of the first heating source.

FIG. 4 shows the fluctuations of the crystallization rate v over the length of the single crystal in the section having a diameter that remains constant on account of the regulation of the heating power of the first heating source as a reaction to a thermal disturbance that has taken place. The crystallization rate v fluctuates with a specific amplitude and frequency around a predefined crystallization rate which is proportional to the desired diameter and at which no excess of intrinsic point defects is formed. A deviation to a higher crystallization rate produces a crystal region V dominated by vacancies, and a deviation to a lower crystallization rate produces a crystal region I dominated by silicon interstitials. According to the invention, the regulation of the diameter and hence the regulation of the crystallization rate v are effected in such a way that the period duration T is not longer than (2·18 mm)/$v_p$ [min]. The regulation is therefore effected with a time constant which is sufficiently short in order that a crystal region which is dominated by one type of intrinsic point defects and which has a length of more than 18 mm cannot grow.

Regulation of the diameter of the single crystal in the section having a diameter that remains constant by means of regulating the heating power LstF of the second heating source arranged around the crucible is not appropriate as an alternative. The thermal mass formed by the crucible and the melt prevents a sufficiently rapid reaction to a thermal disturbance. However, it is advantageous and therefore preferred to use the heating power LstF of the second heating source as a manipulated variable of a downstream regulation of deviations of the heating power LstR of the first heating source from the predefined curve, particularly if the deviations persist over a relatively long period of time. They are then also manifested as a disturbance of the quotient v/G in the center of the single crystal. Such a disturbance cannot be eliminated despite radial diffusion of intrinsic point defects. The downstream regulation is effected in a manner that involves compensating for deviations of the heating power of the first heating source from the predefined curve by changing the heating power of the second heating source, for example if they exist, on average, for longer than $(2\cdot18\text{ mm})/v_p$ [min].

EXAMPLE

Single crystals composed of silicon having a desired diameter of 305 mm were pulled, with predefined curves for the pulling rate $v_p$, the heating power LstR of the first heating source and the heating power LstF of the second heating source which had been chosen in such a way that no accumulations of intrinsic point defects in the form of FPDs or Lpits formed in the case of a disturbance-free progression. The distance D between the bottom surface of the first heating source 4 and the surface of the melt 2 was 50 mm, and the distance d between the side surface of the single crystal 1 and the inner surface of the first heating source 4 was 30 mm (FIG. 1). At various points in time during the crystal growth, which corresponded to a specific grown length L of the section having a diameter that remains constant, a thermal disturbance was brought about in the melt by the heating power LstF of the second heating source being abruptly lowered by 1 kW at the lengths 150 mm and 400 mm (disturbances 1 and 2), and being abruptly raised by 1 kW at the lengths 650 mm and 900 mm (disturbances 3 and 4) (FIG. 5).

In response to these thermal disturbances, which brought about a change in the diameter, the reaction involved regulating the pulling rate $v_p$ in the case of the disturbances 1 and 3 at the lengths 150 mm and 650 mm and regulating the heating power LstR of the first heating source in the case of the disturbances 2 and 4 at the lengths 400 mm and 900 mm, where diameter fluctuations in the case of the regulation by means of LstR were corrected with a period duration T that was less than $(2\cdot18\text{ mm})/v_p$.

Figure 5:
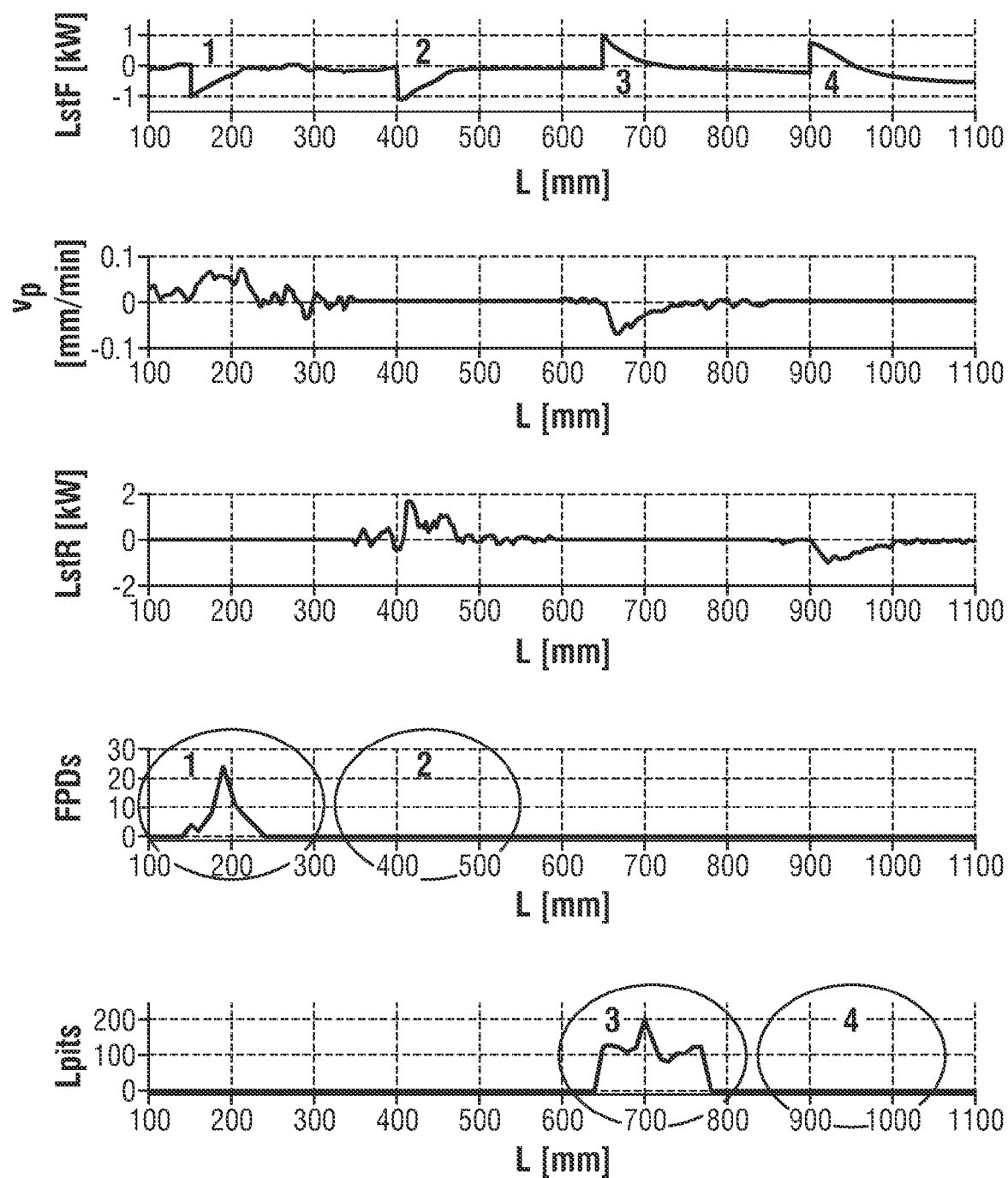
FIG. 5 illustrates accumulations of defects when the inventive method is used, and where diameter is adjusted by means of varying the pull rate $v_p$.

As the result, which is illustrated in FIG. 5, undesired accumulations of intrinsic point defects in the form of FPDs and Lpits formed only in the case of the reaction to the disturbances 1 and 3, when the regulation of the diameter was effected by means of regulating the pulling rate $v_p$.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for pulling a single crystal comprising silicon with a section having a diameter that remains constant, by crystallizing silicon from a melt of silicon contained in a crucible, comprising providing a first heating source which supplies heat to the single crystal and to a region of the melt that adjoins the single crystal, the first heating source being arranged above the melt;

providing a second heating source which is arranged around the crucible;

pulling the single crystal with a predefined desired pulling rate $v_p$ having the units [mm/min], wherein a predefined curve for $v_p$, a predefined curve for the heating power of the first heating source, and a predefined curve for the heating power of the second heating source, for a disturbance-free case are chosen such that the quotient v/G of the crystallization rate v and the axial temperature gradient G at the phase boundary between the growing single crystal and the melt corresponds to a critical value at which neither vacancies nor silicon interstitials are formed in excess; and regulating the diameter of the single crystal in the section having a diameter that remains constant to a predefined diameter by means of regulating the heating power of the first heating source, such that diameter fluctuations are corrected with a period duration T that is not longer than $(2\cdot18\text{ mm})/v_p$, wherein the heating power of the second heating source is used as a manipulated variable of a downstream regulation for bringing back deviations of the heating power of the first heating source from the predefined curve for the heating power of the first heating source, if the deviations persist over a long period of time.

2. The method of claim 1, wherein the first heating source is positioned above a melt surface and within a heat shield positioned between an inner wall of the crucible and the single crystal.

3. The method of claim 1, wherein a bottom surface of the first heating source is from 30 to 70 mm above the surface of the silicon melt.

4. The method of claim 1, wherein a distance d between a side surface of the single crystal and an inner surface of the first heating source is from 10 to 50 mm.

* * * * *